United States Patent [19]
Hibino

[11] Patent Number: 6,130,158
[45] Date of Patent: *Oct. 10, 2000

[54] FILLING CONNECTION HOLE WITH WIRING MATERIAL BY USING CENTRIFUGAL FORCE

[75] Inventor: Satoshi Hibino, Hamamatsu, Japan

[73] Assignee: Yamaha Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/599,646

[22] Filed: Feb. 12, 1996

[30] Foreign Application Priority Data

Feb. 15, 1995 [JP] Japan .................................. 7-026794

[51] Int. Cl.⁷ .................................................. H01L 21/44
[52] U.S. Cl. ........................... 438/675; 438/626; 438/675; 438/760; 438/688
[58] Field of Search .................................... 437/195, 225, 437/228, 231; 438/675, 760, 688, 626, 637, 660, 715, 747

[56] References Cited

U.S. PATENT DOCUMENTS

| | | | |
|---|---|---|---|
| 4,832,781 | 5/1989 | Mears | 156/345 |
| 4,970,176 | 11/1990 | Tracy et al. | 437/187 |
| 5,266,521 | 11/1993 | Lee et al. | 437/188 |
| 5,290,731 | 3/1994 | Sugano et al. | 437/174 |
| 5,371,042 | 12/1994 | Ong | 437/194 |
| 5,624,870 | 4/1997 | Chien et al. | 438/653 |
| 5,714,417 | 2/1998 | Kung | 438/626 |
| 5,824,562 | 7/1995 | Park | 438/637 |

FOREIGN PATENT DOCUMENTS

| | | |
|---|---|---|
| 2-35732 | 2/1990 | Japan . |
| 235732 | 2/1990 | Japan . |
| 5-3257 | 1/1993 | Japan . |
| 6-112203 | 4/1994 | Japan . |
| 6-169018 | 6/1994 | Japan . |

Primary Examiner—David Nelms
Assistant Examiner—Reneé R. Berry

[57] ABSTRACT

A method of manufacturing a semiconductor device includes the steps of: preparing a substrate having an insulating layer with a connection hole; forming a wiring layer covering the connection hole; and heating the substrate to a temperature equal to or higher than a temperature of fluidizing the wiring layer material and rotating the substrate in a direction of generating centrifugal force directing from an opening of the connection hole toward the bottom of the connection hole. The centrifugal force facilitates reflow of the wiring layer so that the inside of the connection hole can be more preferably filled and the surface of the wiring layer can be planarized.

10 Claims, 4 Drawing Sheets

FILLING CONNECTION HOLE WITH WIRING MATERIAL BY USING CENTRIFUGAL FORCE

BACKGROUND OF THE INVENTION a) Field of the Invention

The present invention relates to techniques of filling a fine contact hole in an insulating layer with wiring material of a wiring layer for the electrical connection between the wiring layer and an underlying layer having a conductive surface.

b) Description of the Related Art

For the electrical connection between an impurity doped layer and a wiring layer over the doped layer or between multi-wiring layers of semiconductor devices, generally a connection hole (e.g. contact hole, via hole) is formed in an insulating layer formed between two layers to be electrically connected, and the connection hole is filled with wiring material. If the connection hole is filled insufficiently, contact failure may occur.

In order to have a good manufacture yield of semiconductor devices, in addition to properly filled connection holes, the wiring layer after the hole filling process is required to have as flat a surface as possible without leaving irregular surfaces. For planarization, a conventional hole filling process uses an etch-back process, an Al reflow sputtering process, and other processes.

An etch-back process is a combination of a conventional film forming process such as sputtering, and an etching process. With this process, wiring material is first deposited thicker than a final wiring layer, by sputtering or other processes. Thereafter, the surface of the wiring layer is planarized by coating material with fluidity such as photoresist. After this photoresist is thermally set, it is dry-etched uniformly from the surface thereof to remove irregular surfaces and obtain a final planarized wiring layer.

An Al reflow sputtering process can be used when Al or Al alloy is used as wiring material. This process sputters wiring material at a substrate temperature at which Al can be fluidized. Since the sputtered film has fluidity, the wiring material flows from convexities to concavities to planarize the wiring layer surface. As compared to usual sputtering, the hole filling performance can be improved, and in addition, planarization is performed at the same time.

As semiconductor devices are becoming highly integrated, the diameters of connection holes are becoming small. An aspect ratio of a depth to a diameter of a connection hole tends to increase. Not only with usual sputtering but also with Al reflow sputtering, the larger is the aspect ratio of a connection hole, the worse is the step coverage of a formed wiring layer and the more difficult is the process of properly filling the connection hole.

SUMMARY OF THE INVENTION

It is an object of the present invention to provide a method of manufacturing a semiconductor device capable of filling a connection hole in a good filled state.

It is another object of the present invention to provide a semiconductor device manufacturing system capable of filling a connection hole in a good filled state.

According to one aspect of the present invention, there is provided a method of manufacturing a semiconductor device comprising the steps of: preparing an underlying substrate having a conductive region; forming an insulating layer on the substrate, the insulating layer having a connection hole at a position corresponding to the conductive region; forming a wiring layer covering the connection hole; and heating the substrate and rotating the substrate in a direction of generating centrifugal force directing from an opening of the connection hole toward the bottom of the connection hole to reflow the wiring layer.

According to another aspect of the present invention, there is provided a semiconductor device manufacturing system comprising: a hermetically sealed chamber capable of being evacuated; semiconductor substrate holding means rotatively mounted in the hermetically sealed chamber and having a holding surface for holding a semiconductor substrate substantially perpendicular to a rotation radius direction; driving means for rotating the semiconductor substrate holding means; and semiconductor substrate heating means for heating the semiconductor substrate held by the semiconductor substrate holding means.

After wiring material is deposited to cover an insulating film with a connection hole, the substrate is heated to a temperature allowing the wiring material to be reflowed, and rotated to apply centrifugal force to the wiring layer with fluidity. Since this centrifugal force is generated in the depth direction of the connection hole, the fluidized wiring material becomes easy to flow toward the bottom of the connection hole and to fill the concave space in the connection hole.

As above, a connection hole can be properly filled with wiring material by using a simple hole filling system, and at the same time the wiring layer can be planarized satisfactory.

DETAILED DESCRIPTION OF THE PREFERRED EMBODIMENTS

Embodiments of the invention will be described with reference to the accompanying drawings.

Embodiments will be described by using an example of filling a contact hole for the electrical connection between a source/drain region of a metal oxide semiconductor (MOS) transistor and a wiring layer.

Figure 2A:
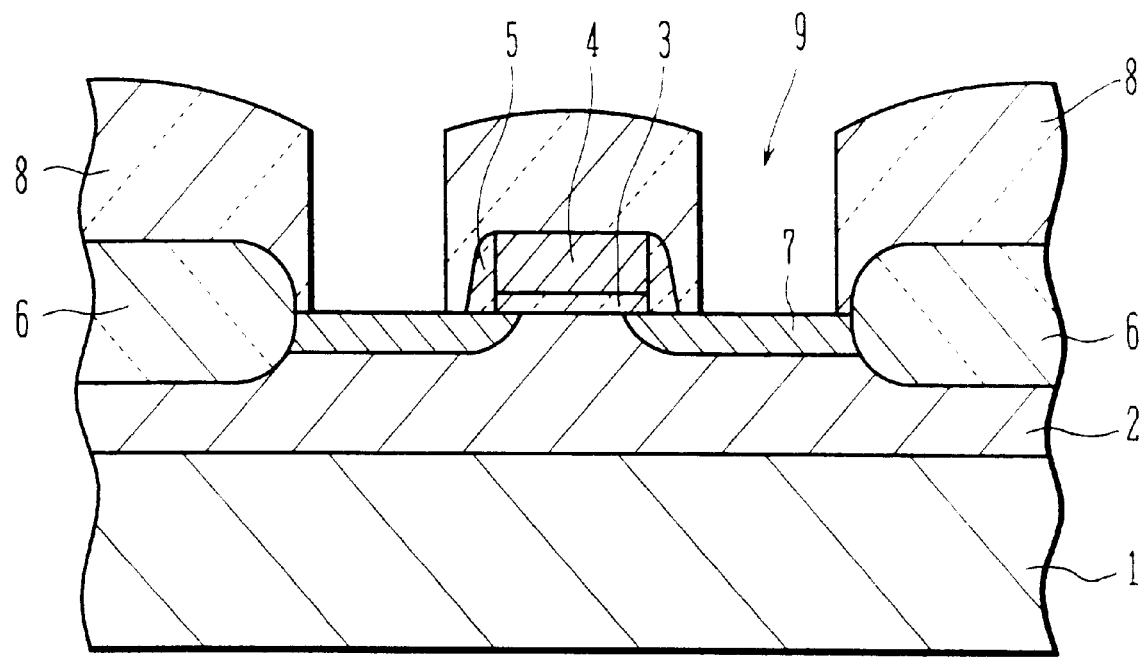
FIGS. 2A and 2B are cross sectional views of semiconductor devices according to an embodiment of the invention.

FIG. 2A is a cross sectional view of a MOS transistor under manufacture processes. Referring to FIG. 2A, in the upper region of an Si substrate 1, a p-/n-well region 2 having a predetermined impurity concentration is formed. On the well region 2, a gate oxide film 3 and a gate electrode 4 are formed. Side spacers 5 made of $SiO_2$ film are formed on the side walls of the gate oxide film 3 and gate electrode 4. In the well surface regions on both sides of the gate electrode, high impurity concentration regions 7 are formed which are served as source/drain regions having a conductive type opposite to the well region 2. Surrounding this transistor structure, a field oxide film 6 is formed by a thick $SiO_2$ film.

Covering these transistor and field oxide film, an interlayer insulating film 8 such as a phosphosilicate glass (PSG)

film or a borophosphosilicate glass (BPSG) film is formed. Contact holes 9 are formed in the interlayer insulating film 8 for the electrical connection between the lower high impurity concentration regions 7 and an upper wiring layer to be later formed. These processes may use conventional MOS transistor manufacture processes.

Figure 2B:
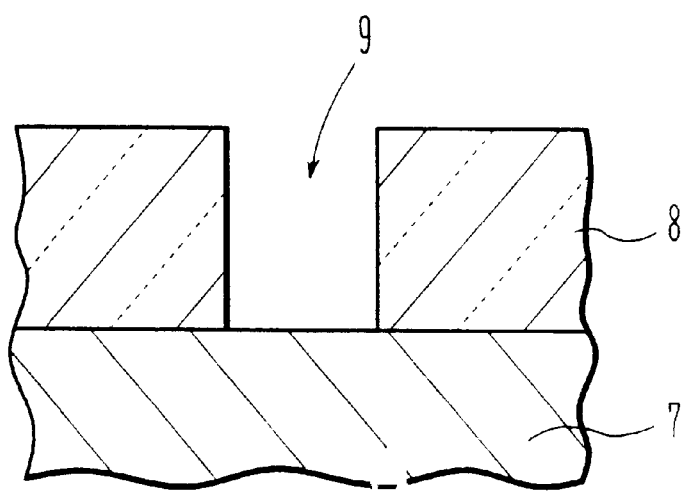

FIG. 2B is a schematic cross sectional view showing the region near the contact hole 9 of the interlayer insulating film 8 exposing the high impurity concentration region 7. The following description relies on this drawing of FIG. 2B. For example, the thickness of the interlayer insulating film 8 is about 700 nm to 1 µm, and the diameter of the contact hole is about 0.5 µm.

Figure 3:
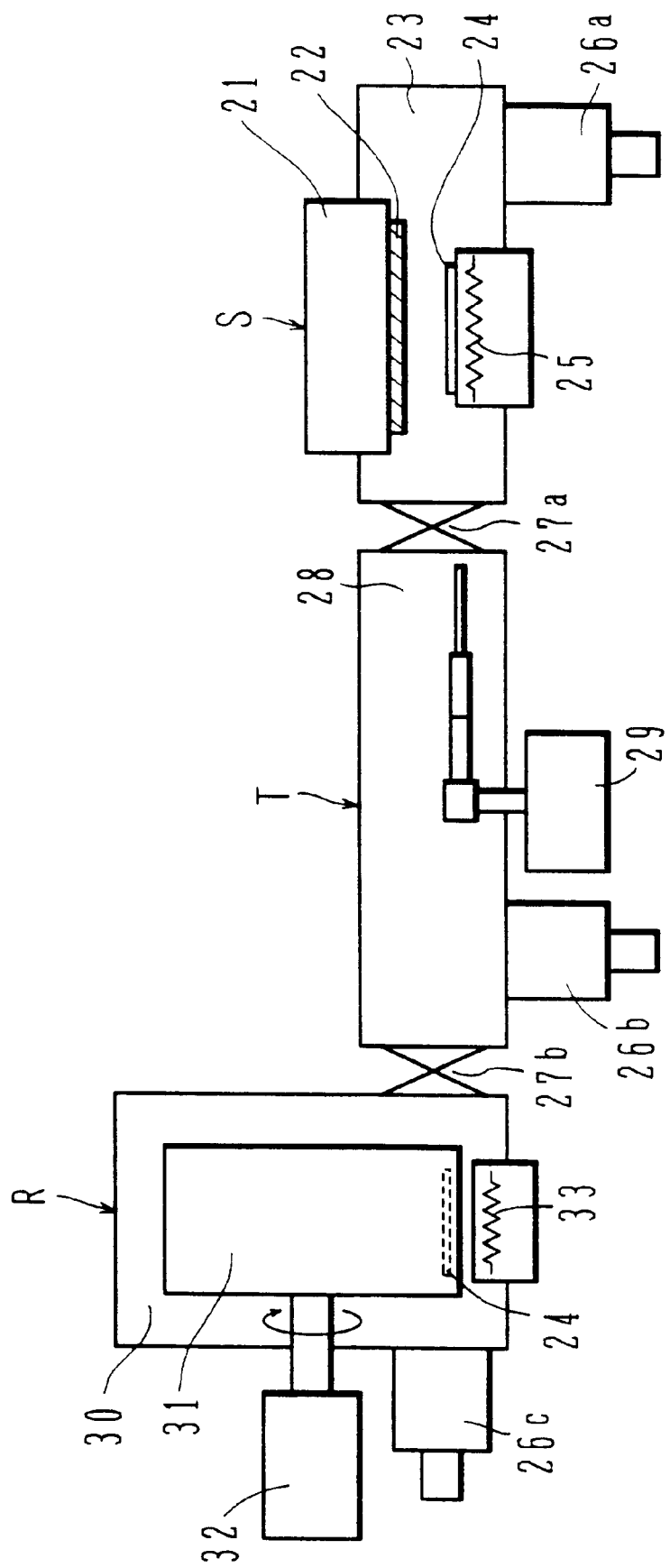
FIG. 3 is a diagram showing the structure of a semiconductor device manufacturing system according to an embodiment of the invention.

The processes to follow are performed, for example, by a semiconductor device manufacturing system shown in FIG. 3, including a sputtering system S, a substrate transport system T, and a hole filling or reflow system R.

First, a wiring layer is formed covering the interlayer insulating film 8, by using the sputtering system S shown in FIG. 3. As shown, this sputtering system is a DC magnetron sputtering system having an upper cathode 21 on which a sputtering target 22 is mounted and a susceptor (counter electrode) on which a substrate 24 is mounted facing the target 22. The substrate 24 is heated to a predetermined temperature with a heater 25 equipped in the susceptor. The interior of the sputtering chamber is maintained to have a predetermined pressure and atmosphere by a vacuum pump 26a and an unrepresented gas supply system.

Wiring material used is those materials having a relatively low melting point, for example, Al and Al alloy such as Al/Si/Cu and Al/Cu. For example, in sputtering an Al/Si/Cu layer, an Al/Si/Cu alloy sputtering target is used under the conditions of an Ar atmosphere, a pressure of 2 mTorr, a DC power of 10 kW, a film forming speed of 1 µm/min, and a substrate temperature of about 200° C. A wiring layer is formed to a thickness of, for example, about 800 nm.

Figure 1A:
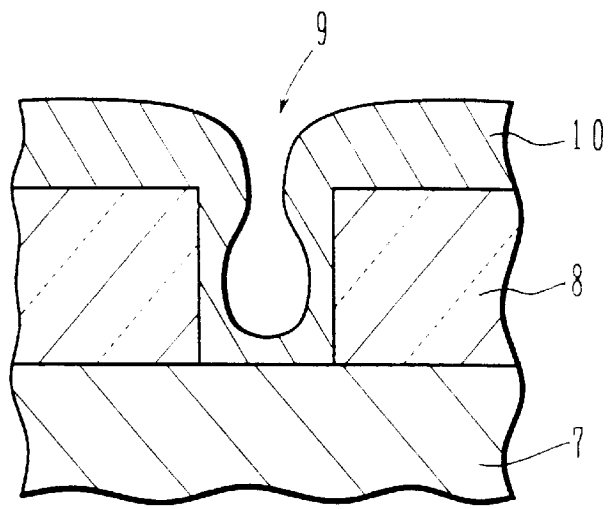
FIGS. 1A to 1C are cross sectional views of a semiconductor device, illustrating a process of filling a contact hole according to an embodiment of the invention.

An example of the configuration of a wiring layer is shown in FIG. 1A and indicated by reference numeral 10. As compared to a thickness of the wiring layer 10 formed on the flat surface of the interlayer insulating film 8, a thickness at the side wall of a contact hole is thin. A concave shape is likely to be left in the contact hole, and insufficient filling of the contact hole is likely to occur. With such insufficient filling of the contact hole, good electrical connection between the wiring layer 10 and high impurity concentration region 7 is often difficult to be obtained. The concave shape of the wiring layer left in the contact hole makes it difficult to pattern a film to be formed on the wiring layer.

In order to improve the filling state of the wiring layer, a reflow process is further performed by using the reflow system R shown in FIG. 3.

The substrate with the wiring layer is transported into the reflow system R having a substrate heating unit 33, a substrate rotating unit 32, and a vacuum pump unit 26c. Although the substrate may be transported from the sputtering system S to the reflow system R under atmospheric conditions, it is desired that as shown in FIG. 3, the substrate is transported by the substrate transport system T at a reduced pressure or in an inert gas atmosphere. Transportation of the substrate at a reduced pressure or in an inert gas atmosphere prevents the surface oxidation of Al or Al alloy and allows reflow to be performed smoothly.

A chamber 28 of the substrate transport system T, the sputtering chamber 23, and a chamber 30 of the reflow system R are coupled via gate valves 27a and 27b which are adapted to be opened and closed. A vacuum pump 26b is coupled to the chamber 28 to maintain a reduced pressure state of the chamber 28. When the substrate is transported from the sputtering system S to the substrate transport system T, the inside of the chamber 28 is adjusted to have the same pressure as the sputtering chamber 23. Thereafter, the gate valve 27a is opened and the substrate 24 in the sputtering system S is transported into the substrate transport system T by a substrate transport robot 29 having a support arm which can be expanded, contracted, moved up and down, and rotated. After this transportation, the gate valve 27a is closed.

The substrate transportation from the substrate transport system T to the reflow system R is performed in a similar manner. After the inside of the reflow chamber 30 is adjusted to have the same pressure as the substrate transport chamber 28, the gate valve 27b is opened. The substrate transport robot 29 expands the support arm and places the substrate 24 held by the arm on a substrate holder mounted on the inner wall of a rotary drum 31 of the reflow system R. Thereafter, the substrate transport robot 29 contracts its arm to retract it in the substrate transport chamber 28, and the gate valve 27b is closed.

The rotary drum 31 in the chamber 30 of the reflow system R has a rotation radius of, for example, about 10 to 50 cm. The substrate 24 is held by the substrate holder mounted on the inner wall of the rotary drum 31. The rotary shaft of the rotary drum 31 is rotated by a motor 32 installed outside of the reflow system R. The axis of the rotary shaft is in the horizontal direction in this embodiment. The surface of the substrate held by the substrate holder faces the rotation center of the rotary drum 31, with the rotation radius coinciding with the normal to the substrate surface.

The vacuum pump 26c coupled to the reflow chamber 30 can maintain the inside of the chamber 30 in a reduced pressure atmosphere. The reduced pressure atmosphere of the reflow chamber 30 is preferable in order to reduce an air flow resistance during the rotation of the rotary drum 31 and suppress the oxidation of wiring material. Although not represented in FIG. 3, gas such as Ar and $N_2$ may be supplied from a gas supply system to the chamber 30. For example, the inside of the reflow chamber may be maintained in an inert gas atmosphere of Ar, $N_2$ or the like. In order to improve a reflow performance, it is preferable to maintain the inside of the reflow chamber 30 in a highly evacuated state of $1\times10^{-7}$ Torr or lower.

The substrate heater 33 for heating a substrate is installed, for example, as shown in FIG. 3 at the outer circumferential area of the rotary drum 31. A plurality of substrate heaters 33 may be installed to heat the substrate to a predetermined temperature. The substrate heater 33 may also be mounted in the rotary drum 31.

Before the start of, or during, the reflow process using the reflow system R, the substrate temperature is set to a temperature from about 350° C. to about 600° C. by considering the fluidizing temperature of wiring material Al/Si/Cu, and more preferably to a temperature from about 400° C. to about 600° C. The rotation speed of the rotary drum during the reflow process is set to a value from about 10 rpm to about 100,000 rpm, more preferably from about 100 rpm to about 100,000 rpm. For example, the rotation speed of the rotary drum 31 may be set to a value from about 10 rpm to about 10,000 rpm or from about 100 rpm to about 10,000 rpm.

Figure 1B:
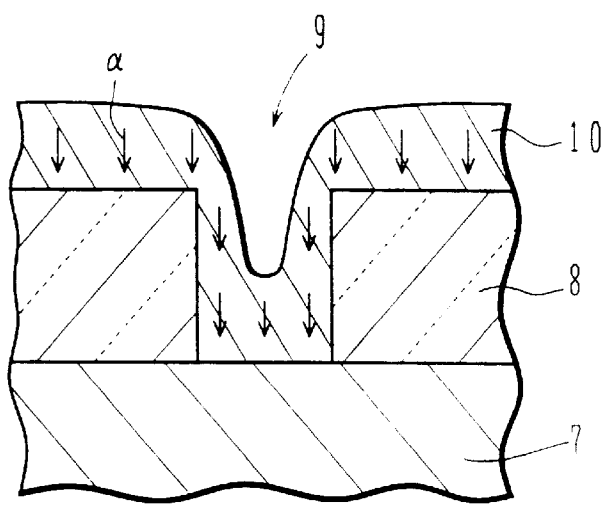

The state of the wiring layer in the contact hole during the reflow process is shown in FIG. 1B. Arrows a indicate the direction of centrifugal force generated while the substrate is rotated in the reflow system R. The centrifugal force is applied uniformly over the whole area of the substrate in the depth direction thereof.

A heated and fluidized wiring layer tends to flow downward by the influence of gravitational force. This flow is not necessarily smooth if viscosity of the layer is rather high. Fluidity may be enhanced by raising the substrate temperature and lowering the viscosity of the wiring material. However, a raised substrate temperature is often undesirable because a problem of surface oxidation, Al migration, or others may occur.

In the above embodiment, however, centrifugal force far greater than gravitational force is applied to a fluidized wiring layer, so that downward fluidity of the wiring layer can be enhanced without raising the substrate temperature too high.

Figure 1C:
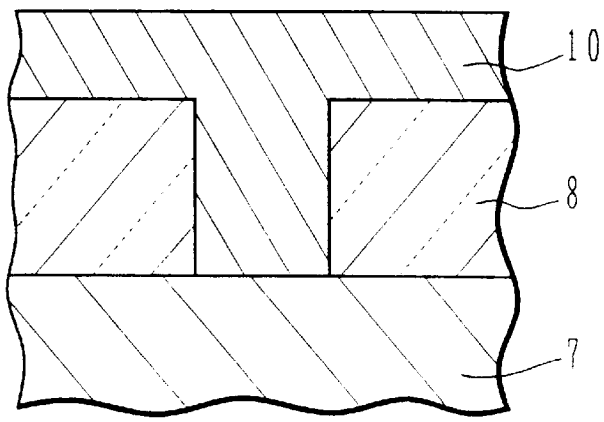

As illustrated in FIG. 1B, fluidized wiring material becomes easy to flow in the direction of centrifugal force and the trench left in the contact hole 9 can be buried preferentially. At the final stage such as shown in FIG. 1C, the inside of the contact hole is completely filled and the surface of the wiring layer 10 is planarized.

In order to improve the reflow performance for a contact hole, it is necessary to apply centrifugal force components from an opening of the contact hole toward the bottom, preferably in coincidence with the depth direction of the wiring layer. Centrifugal force is generated outward from the rotation center, i.e., along the axis perpendicular to the tangent plane of a rotation circumference. It is therefore preferable to make the normal to the substrate surface be coincident with the rotation radius direction.

It is expected that this flow is effective also for removing voids, if any, in the wiring layer filling a contact hole, immediately after the formation of the wiring layer. Such voids are formed during the film forming process so that they are usually at a reduced pressure which corresponds to the reduced pressure atmosphere maintained during the film formation. It is considered that the fluidized wiring layer applied with centrifugal force crashes these reduced pressure voids and inert gas in the voids is dissolved in the nearby wiring layer.

Alternatively, it is considered that the wiring material over a void flows in the contact hole by centrifugal force to open the upper wall of the void and this recess of once the void is filled with the wiring material.

The sputtering system, substrate transport system, and reflow system are not limited to the structure shown in FIG. 3. An example of another system structure is shown in the plan view of FIG. 4 which has a reflow system having a different rotation direction from that shown in FIG. 3. The substrate rotation axis of the reflow system R shown in FIG. 4 extends in a vertical direction different by 90 degrees from that of the reflow system R shown in FIG. 3. Obviously, either of the rotation axes may be applied.

Figure 4:
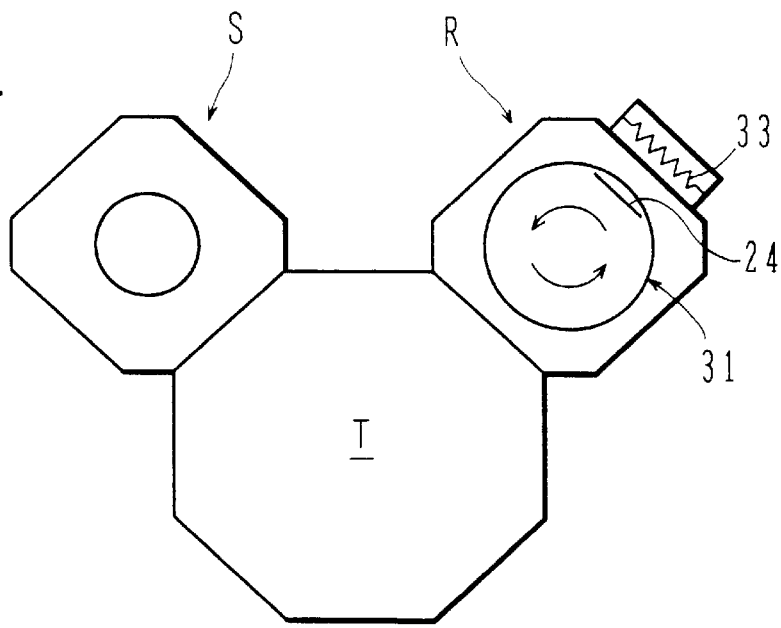
FIG. 4 is a diagram showing the structure of a semiconductor device manufacturing system according to another embodiment of the invention.

In FIG. 4, the sputtering system S and reflow system R are disposed around the substrate transport system T and connected thereto. A plurality of different systems may be connected around the substrate transport system T. The substrate transport system T transports a substrate to and from the sputtering system S and reflow system R in the manner similar to the system structure shown in FIG. 3.

In this structure of the reflow system having a vertical rotation axis of the rotary drum, a substrate transport chamber for accommodating a substrate transport cassette may be provided at the upper or lower area of the rotary drum. In this case, a substrate transported by the substrate transport system T is loaded in the substrate transport cassette, and the cassette is moved upward or downward to place the substrate on a substrate holder on the inner wall of the rotary drum.

In the above embodiments, the film forming system and the reflow system for performing a high temperature rotation process are independent and separate systems. Therefore, the reflow system can be made having a relatively simple structure without making it complicated. A method of forming a wiring layer is not limitative, but any other film forming systems may be used. In addition to a usual DC sputtering system, other sputtering systems may be used, such as high frequency sputtering and collimation sputtering. Film forming systems such as a thermal CVD system and a plasma CVD system may also be used.

It is not always necessary to perform a wiring layer forming process and a reflow process by independent and separate systems, but the film forming system itself may be provided with a rotation mechanism to perform the rotation process after or at the same time the film is formed.

In the above embodiments, the radius of the rotary drum of the reflow system is set in a range from about 10 m to about 50 cm and the rotation speed is set in a range from about 10 rpm to about 100,000 rpm, e.g., in a range from about 100 rpm to about 100,000 rpm. These conditions are not limitative. In order to improve the reflow performance for a contact hole, centrifugal force applied to the substrate during the reflow process is desired to be large. A centrifugal force is generally defined by $mr\omega^2$ where m is a mass of substance to which a centrifugal force is applied, r is a rotation radius, and $\omega$ is an angular velocity. In order to increase centrifugal force, either the rotation radius or the angular velocity (rotation speed) is made as large as possible.

Even if both the rotation radius and rotation speed are smaller than those values used in the embodiments, it can be expected that the reflow performance can be improved if centrifugal force toward a contact hole is generated, as compared to the case the substrate is heated to a temperature sufficient for fluidizing wiring material, without applying any centrifugal force.

It can also be expected that the reflow performance can be improved even at a substrate temperature slightly lower than the temperature used by usual Al reflow or other processes, because centrifugal force generated by the rotation of the substrate enhances the fluidity in the depth direction of a contact hole.

The same effects may be expected even if the direction of generated centrifugal force is not coincident with the substrate depth direction so long as the centrifugal force has vector components in the depth direction. In this meaning, the term "normal" or "perpendicular" does not strictly mean the exact normal or the exact perpendicular, but can be nearly normal or nearly perpendicular provided that the generated centrifugal force is similar.

Figure 5:
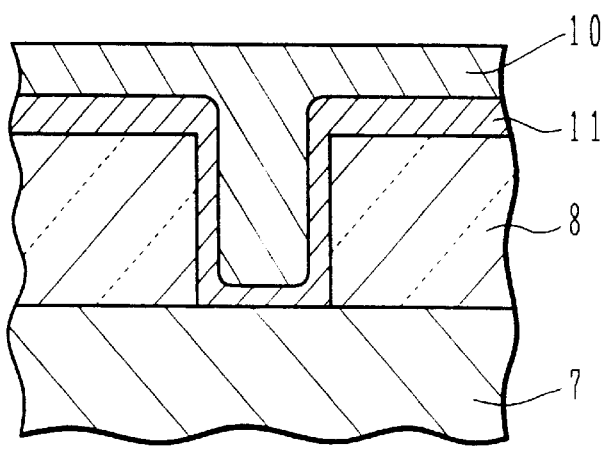
FIGS. 5 and 6 are cross sectional views of semiconductor devices according to other embodiments of the invention.

In the above embodiments, a single layer of Al/Si/Cu is used as the wiring layer. As shown in FIG. 5, a barrier metal layer 11 such as a WSi layer, a Ti layer, a TiN layer, and a TiON layer may be used as an underlying layer of an Al alloy layer 10. In this case, the barrier metal layer 11 is formed to about 50 nm thick by sputtering before the Al alloy layer is formed. For example, a TiN barrier layer of 50 nm thick is formed through reactive sputtering under the conditions of a nitrogen pressure in a sputtering atmosphere of 4 mTorr, a substrate temperature of 200° C., a power of 6 kW, and a target of Ti. The processes to follow for forming an Al alloy layer and reflowing it are similar to the embodiment processes.

Figure 6:
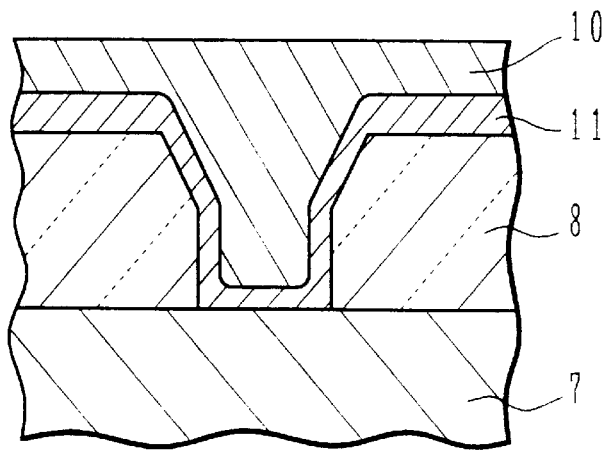

In the above embodiments, a contact hole is filled with wiring material for the electrical connection between source/drain regions of a MOS transistor and a wiring layer. The embodiment processes may be used for filling a well contact hole with wiring material for the connection between a p- or n-type well region and a wiring layer or for filling a via hole with a wiring layer for the connection between upper and lower wiring layers of multi-wiring layers. In this specification, both a contact hole and a via hole are collectively called a connection hole. A connection hole in an insulating film may be formed with a taper particularly at the upper portion of the hole, such as shown in FIG. 6.

The embodiment method is considered to become more effective, as the large the aspect ratio of a depth to a diameter of a connection hole becomes.

The present invention has been described in connection with the preferred embodiments. The invention is not limited only to the above embodiments. It is apparent to those skilled in the art that various modifications, improvements, combinations and the like can be made without departing from the scope of the appended claims.

What is claimed is:

1. A method of manufacturing a semiconductor device comprising the steps of:

preparing an underlying substrate having a conductive region;

forming an insulating layer on said substrate, said insulating layer having a connection hole at a position corresponding to said conductive region;

forming a wiring layer covering said connection hole in an evacuated state;

while keeping the evacuated state after said step of forming a wiring layer, heating said substrate to enable reflow of the wiring layer and rotating said substrate in a direction of generating centrifugal force in a depth direction of the substrate, the centrifugal force being directed from an opening of said connection hole toward a bottom of said connection hole to enhance reflow of the wiring layer.

2. A method of manufacturing a semiconductor device according to claim 1, wherein said wiring layer comprises Al or Al alloy.

3. A method of manufacturing a semiconductor device according to claim 2, wherein said wiring layer comprises a layer formed of at least one selected from a group consisting of WSi, Ti, TiN, and TiON, under said Al or Al alloy layer.

4. A method of manufacturing a semiconductor device according to claim 1, wherein at said reflow step said substrate is heated to a temperature in a range from about 350° C. to about 600° C.

5. A method of manufacturing a semiconductor device according to claim 1, wherein at said reflow step said substrate is heated to a temperature in a range from about 400° C. to about 600° C.

6. A method of manufacturing a semiconductor device according to claim 1, wherein at said reflow step said substrate is rotated at a rotation speed in a range from about 10 rpm to about 100,000 rpm.

7. A method of manufacturing a semiconductor device according to claim 1, wherein at said reflow step said substrate is rotated at a rotation speed in a range from about 10 rpm to about 10,000 rpm.

8. A method of manufacturing a semiconductor device according to claim 1, wherein at said reflow step said substrate is rotated at a rotation speed in a range from about 100 rpm to about 100,000 rpm.

9. A method of manufacturing a semiconductor device according to claim 1, wherein at said reflow step said substrate is rotated about a horizontal axis.

10. A method of manufaturing a semiconductor device according to claim 1, wherein at said reflow step said substrate is rotated about a vertical axis.

* * * * *